United States Patent
Lubomirsky et al.

(10) Patent No.: US 6,597,051 B2
(45) Date of Patent: Jul. 22, 2003

(54) THERMOELECTRIC INFRARED DETECTOR

(75) Inventors: Igor Lubomirsky, Petach Tikva (IL); Konstantin Gartsman, Rehovot (IL)

(73) Assignee: Yeda Research and Development Co. Ltd., Rehovot (IL)

( * ) Notice: Subject to any disclaimer, the term of this patent is extended or adjusted under 35 U.S.C. 154(b) by 2 days.

(21) Appl. No.: 09/863,870

(22) Filed: May 22, 2001

(65) Prior Publication Data

US 2003/0025174 A1 Feb. 6, 2003

(51) Int. Cl.[7] .............................................. H01L 31/06
(52) U.S. Cl. ....................... 257/461; 257/464; 257/465; 257/431; 257/436; 438/55
(58) Field of Search ................................. 257/461, 464, 257/465, 431, 436; 438/55

(56) References Cited

U.S. PATENT DOCUMENTS

| | | | |
|---|---|---|---|
| 3,989,946 A | * 11/1976 | Chapman et al. | 250/332 |
| 4,321,615 A | * 3/1982 | Blackman et al. | 357/30 |
| 4,558,342 A | 12/1985 | Sclar | 357/30 |
| 5,059,543 A | 10/1991 | Wise et al. | 437/3 |
| 5,897,330 A | * 4/1999 | Watanabe et al. | 438/55 |
| 6,046,398 A | 4/2000 | Foote et al. | 136/201 |
| 6,222,243 B1 | * 4/2001 | Kishi et al. | 257/467 |

FOREIGN PATENT DOCUMENTS

JP 07283444 A * 10/1995

* cited by examiner

*Primary Examiner*—Martin J. Flynn
*Assistant Examiner*—Remmon R. Fordé
(74) *Attorney, Agent, or Firm*—Fitch, Even, Tabin & Flannery

(57) ABSTRACT

A thermoelectric infrared detector comprising a substrate and two kinds of conducting pillars. The pillars longitudinally extend away from the substrate towards incident infrared radiation. The pillars have upper, hot ends remote from the substrate and lower ends at the substrate. Pairs of adjacent pillars of different kinds are electrically connected by a conducting junction at their upper ends, and thereby define thermocouples. The junctions of different pairs of pillars are exposed to the incident radiation.

23 Claims, 9 Drawing Sheets

THERMOELECTRIC INFRARED DETECTOR

FIELD OF THE INVENTION

This invention relates to infrared detectors and, more particularly, to thermopile infrared detectors.

BACKGROUND OF THE INVENTION

Detectors of the kind to which the present invention refers are based on a phenomenon known as the Seebeck effect. This effect occurs when two conductors of different materials are joined by junctions at their ends and one junction is maintained at a higher temperature than the other, causing a voltage difference to arise, and an electric current to flow between the hot and the cold junctions. Since for a given combination of martials the voltage difference varies in direct proportion to the temperature difference, the Seebeck effect has been utilized for the accurate measurement of temperature by means of a thermocouple detector in which one junction is maintained at a known reference temperature and the other at the location where the temperature is unknown. By measuring the voltage drop across the junctions, the unknown temperature can be deduced. Due to their very low electrical impedance, thermocouples require the use of a low-input impedance readout circuit, although such a circuit produces excessive electrical noise. To avoid this problem, it has been known to increase the impedance of thermocouple detectors by electrically connecting several thermocouples in series forming a thermopile detector.

In known infrared imaging applications, a plurality of thermopiles is connected in series to form a pixel, and many pixels are packed in an array with the geometry of the thermopiles and the spacing between them being small enough to provide acceptable image resolution and a fast response time.

A number of patents disclose various thermopile arrays and their method of production using semiconductor microprocessing technology, which substantially reduces the cost of mass production. U.S. Pat. No. 4,558,342, U.S. Pat. No. 5,059,543, and U.S. Pat. No. 6,046.398 disclose the formation of thin thermocouples, which lie flat on the surface of a thin supporting dielectric membrane and are generally perpendicular to the direction of incident radiation to be detected.

SUMMARY OF THE INVENTION

The present invention provides for a thermoelectric infrared detector to be exposed to incident infrared radiation comprising a substrate And two kinds of conducting pillars longitudinally extending away from the substrate towards the incident radiation. The pillars have upper, hot ends that are remote from the substrate and lower ends at the substrate. Pairs of adjacent pillars of different kinds are electrically connected by conducting junctions at their upper ends, and thereby define a plurality of thermocouples, with the junctions being exposed to incident infrared radiation. The thermocouples may be connected in series to form pixels, which may then be grouped into a detector array.

With the configuration of thermocouples in accordance with the present invention, the substrate and pillars are hidden from incident radiation by the junctions, which occupy most of the area exposed thereto, thereby allowing for a more sensitive and more efficient detection. In order to further maximize the area from which the junctions may benefit, the junctions may also be covered by a thin, electrically insulated membrane, which will capture radiation falling in the spaces between the junctions and conduct it thereto.

The sensitivity of the detector of the present invention to incident radiation can be estimated as follows. For a semiconducting pillar of height l and square cross-section d, the thermal conductance, $G_c$, of the pillar is:

$$G_c \approx \lambda \cdot d^2/l, \quad (1)$$

where $\lambda$ is a specific heat conductivity.

The heat conductance due to thermal radiation can be expressed by:

$$G_r = 8 \cdot \pi \cdot \eta \cdot \sigma \cdot d \cdot T^3 (d+4 \cdot l), \quad (2)$$

where $\eta$ is emissivity and $\sigma$ is Stefan's constant.

The total thermal conductance $G_t$ is the sum of $G_c$ and $G_r$.

Heat capacitance, H, of the pillar is given by:

$$H = C \cdot d^2 \cdot l \quad (3)$$

and the thermal time constant is given by:

$$\tau = H/G_t \quad (4)$$

Equation 4 sets the dependence between l and d for every required time constant, $\tau$. Calculations show that, for example, for d=1–50 μm and τ=1–10 msec, the length of the pillar should be made l=50–350 μm.

Noise in the detector's output signal originates mainly from thermal fluctuations in the detector material and from the Johnson's noise incurred by the pillar's electrical resistance R, which is given by:

$$R = \rho \cdot l/d^2$$

where $\rho$ is specific resistance of the semiconductor.

Noise equivalent power (NEP) of the thermopile, which is the inverse of detectivity, can be estimated as:

$$NEP = \sqrt{\frac{4 \cdot k \cdot T \cdot G_t}{d^2}\left(T + \frac{R \cdot G_t}{\eta^2 \cdot P^2}\right)} \cdot f.$$

where k is Boltzmann's constant, f is filling factor and P is Seebeck coefficient. Since the Seebeck coefficient of a semiconductor increases with increasing conductivity, it is always preferable to employ the most conductive, but not degenerate, semiconductor. For example, if the filling factor is about 50%, $\eta \approx 1$, $\rho = 0.5$ Ω·cm and P≈2 mV/K, then the NEP is in the $10^{-8}$ $Ws^{1/2}$/cm range for a silicon based detector. This is just few a hundred times below the ultimate theoretical limit set by thermal fluctuations ($8 \cdot 10^{-11}$ $Ws^{1/2}$/cm at 25° C.).

FIG. 11 shows a graph of the NEP, measured in $Ws^{1/2}$/cm, for two different time responses of a silicon based detector of the present invention as a function of pillar thickness d, measured in μm. Here, the Seebeck coefficient P is 3 mV/K and the specific resistance ρ is 0.1 Ω·cm. The solid line represents a time response τ of 10 ms, which corresponds to a pillar height l of 350 μm. The dashed line represents a time response τ of 1 ms, corresponding to a pillar height l of 150 μm.

The calculations given above set the lower border of the performance of a detector of the present invention, because it was assumed that the pillars are evenly heated. In practice, it may be enough to warm a part of the pillar at its upper end, to a depth equal to the charge carrier mean free path in order to get the same value of thermoelectric power. Therefore, the NEP will actually be 5 to 50 times larger depending on the pillar height and material. Calculations indicate that a detector manufactured from a semiconductor having a larger carrier mobility and a lower thermal conductivity than that of silicon, such as GaAs for example, will operate at the thermodynamic detectivity limit thereby improving performance.

The performance of the detector can be further improved by using mushroom-shaped pillars, thereby increasing the radiation absorption area of the pillars without increasing their width. This can also be achieved by covering the pillar by a thin, electrically-insulated heat-conducting continuous or non-continuous membrane.

The detector of the present invention may be manufactured by the use of known integrated technology methods. Thus, for example, the pillars can be fabricated by subsequent doping and Deep Reactive Ion Etching (DRIE) of a semiconductor substrate. The pillars can also be fabricated from a wide variety of thermoelectric materials and by different means, including additive technology.

The manufacturing process for a detector according to the present invention is compatible with most of the currently used micro-fabrication practices and, therefore, may be considerably less expensive.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

Figure 1:
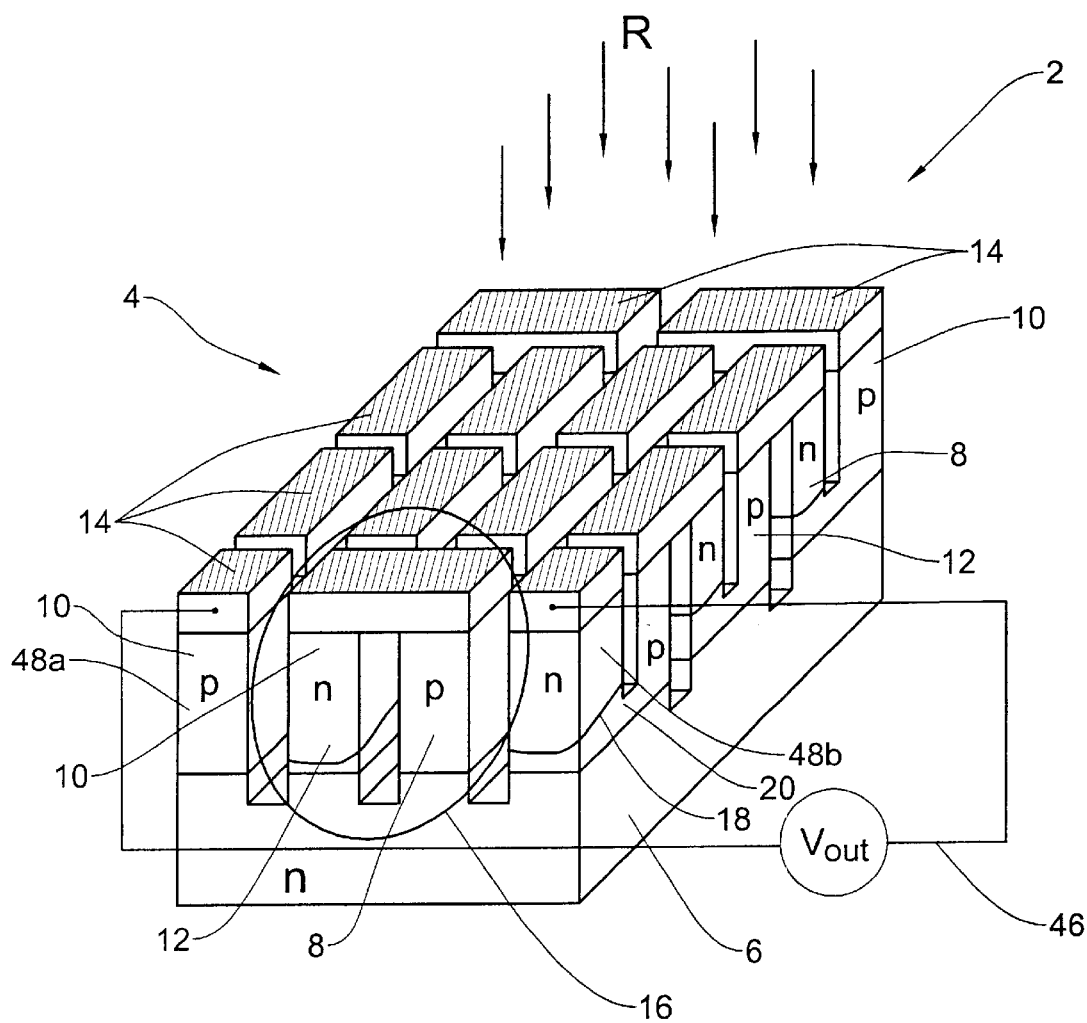
FIG. 1 illustrates a thermoelectric infrared detector of the present invention.

A thermoelectric detector for detecting incident infrared radiation according to the present invention is schematically shown in FIG. 1. The detector 2 has a face 4 defining an area exposed to the incident radiation R and comprises a substrate 6 spaced from and extending parallel to the face 4. Conducting pillars 8 of two kinds p and n having different conductivities, project from the substrate 6 towards the face 4. The pillars 8 have upper, hot ends 10 remote from the substrate 6 and lower ends 12 at the substrate 6.

Two adjacent pillars 8 of different kinds are electrically connected by conducting junctions 14, which fully cover their upper ends 10. Most of the area of the face 4 is occupied by the junctions 14. Each pair of pillars 8 with its junction 14 defines a thermocouple 16. Consecutive thermocouples 16 are connected to each other in series near the lower ends 12 of their adjacent pillars 8 of different kids, at a contact region 18, which is in the form of a shared layer 20.

In operation, the incident radiation R strikes the junctions 14 in a direction generally parallel to the pillars 8, heating the junctions 14 and the upper ends 10 of the pillars 8, thereby triggering the Seebeck effect. By measuring the induced voltage drop across the detector 2, the temperature of the body emitting the incident radiation R can be ascertained.

The detector can be manufactured in many ways, one of which will now be described with reference to FIGS. 2 to 6.

Figure 2:
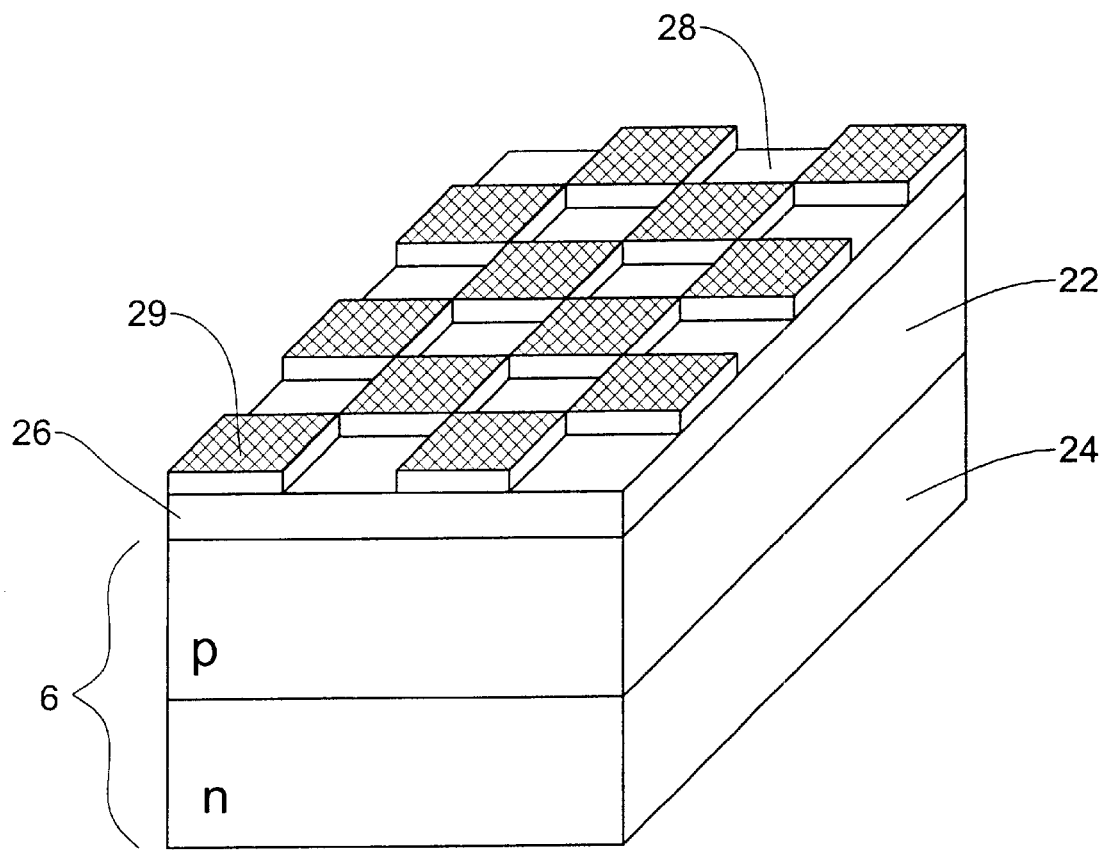
FIGS. 2 to 6 illustrate different steps of a method of producing a thermoelectric infrared detector shown in FIG. 1, FIGS. 7a–7c illustrate an array of pixels made up of thermoelectric infrared detectors according to the present invention.
Figure 3:
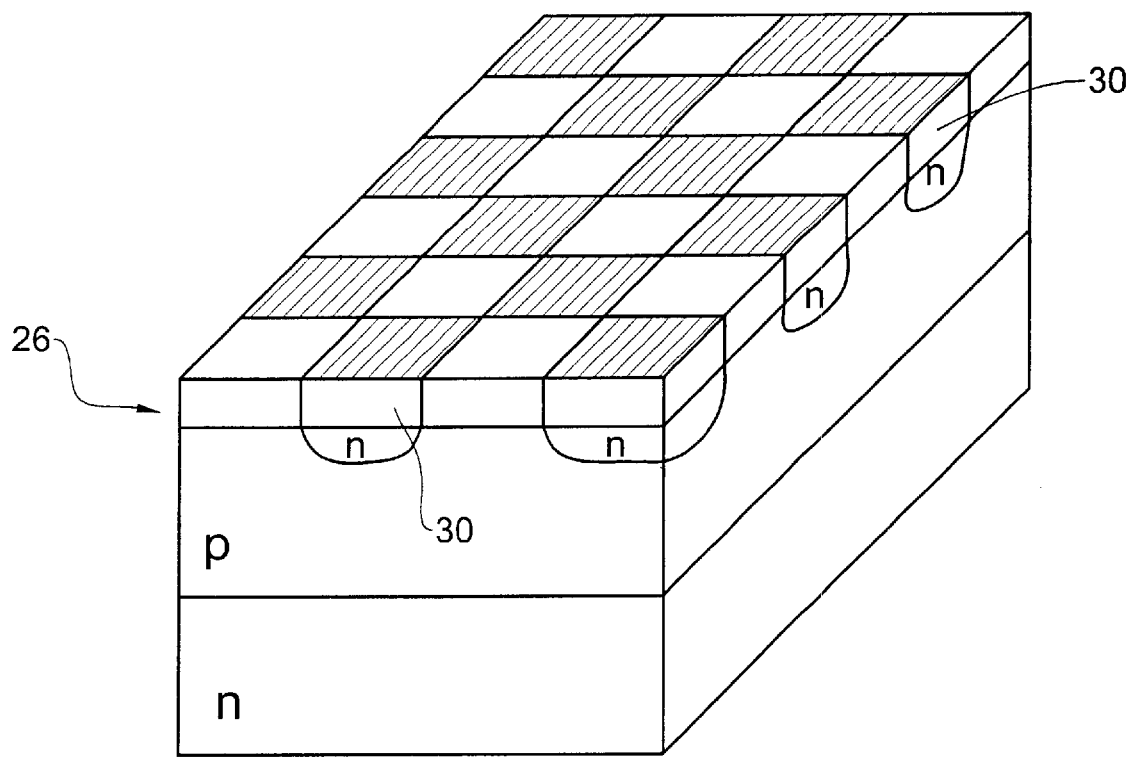

As shown in FIG. 2, the first step of producing a thermoelectric infrared detector of the present invention, is the preparation of a p-type semiconducting layer 22 having a thickness of 30–400 μm on a n-type silicon wafer 24 forming the substrate 6. A diffusion masking layer 26 of silicon nitride or silicon oxide, for example, having a thickness of between 0.3 and 5 μm is deposited by chemical vapor deposition (CVD) above the p-type layer 22. A structure of squares 28 in a chessboard pattern is formed within the masking layer 26 by photolithography using photoresist squares 29 and subsequent etching of unmasked regions. As seen in FIG. 3, the photoresist squares are removed and the etched empty squares are then filled with sodium glass 30. Sodium glass 30 is a source of Na dopant and therefore converts a thin area of p-type silicon beneath the layer of sodium glass 30 into n-type during its deposition. Ion implantation of sodium can be performed instead of the latter step, as it will yield the same results.

Figure 4:
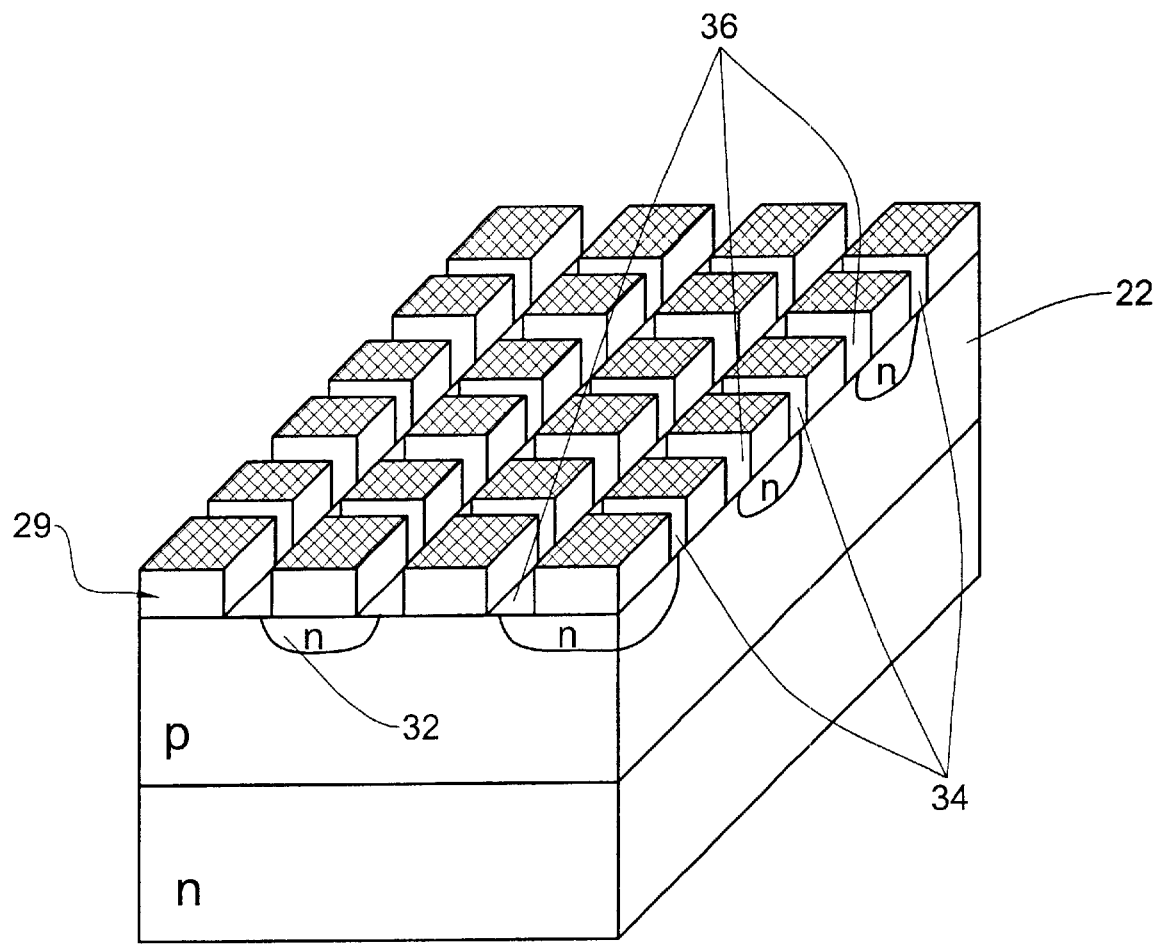
Figure 5:
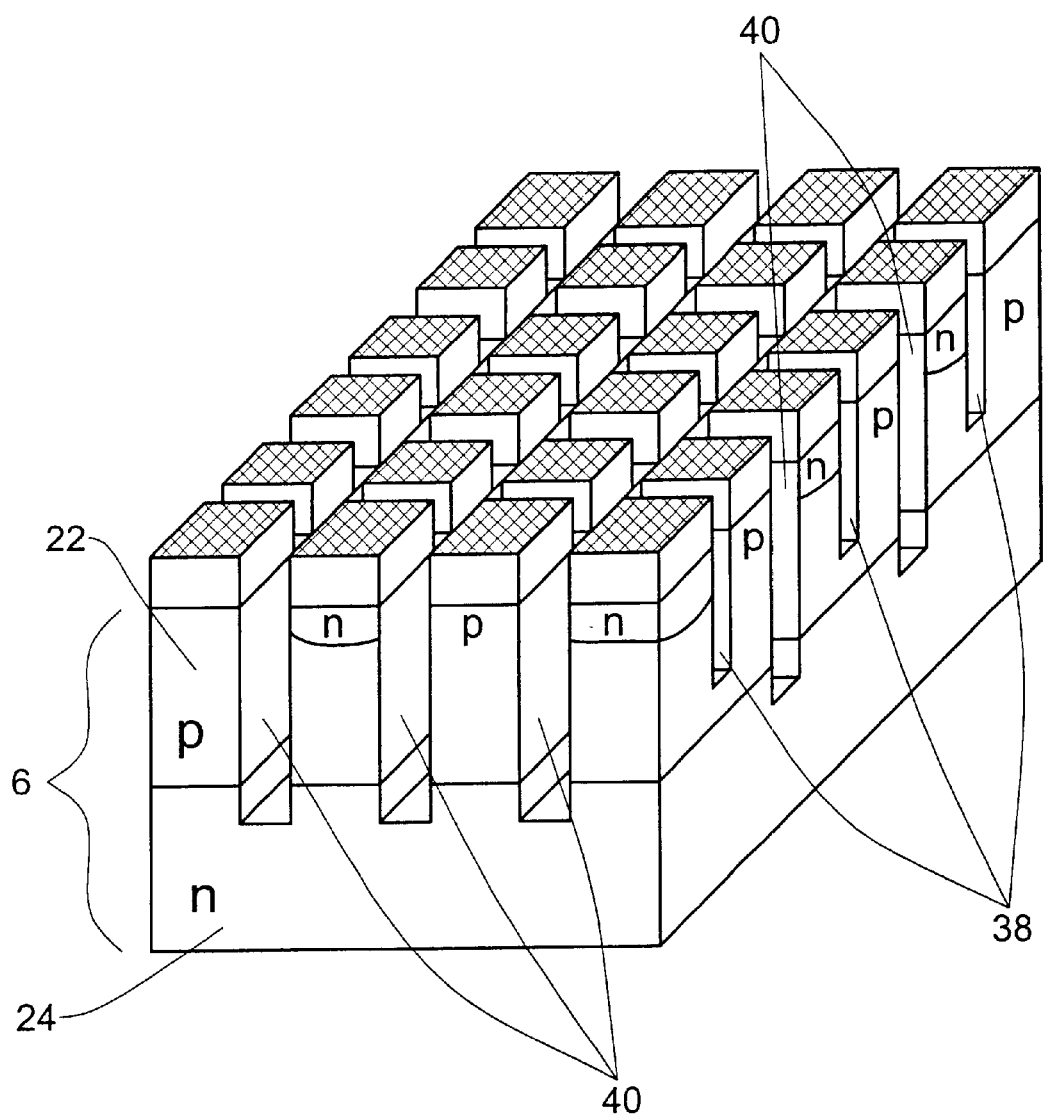
Figure 6:
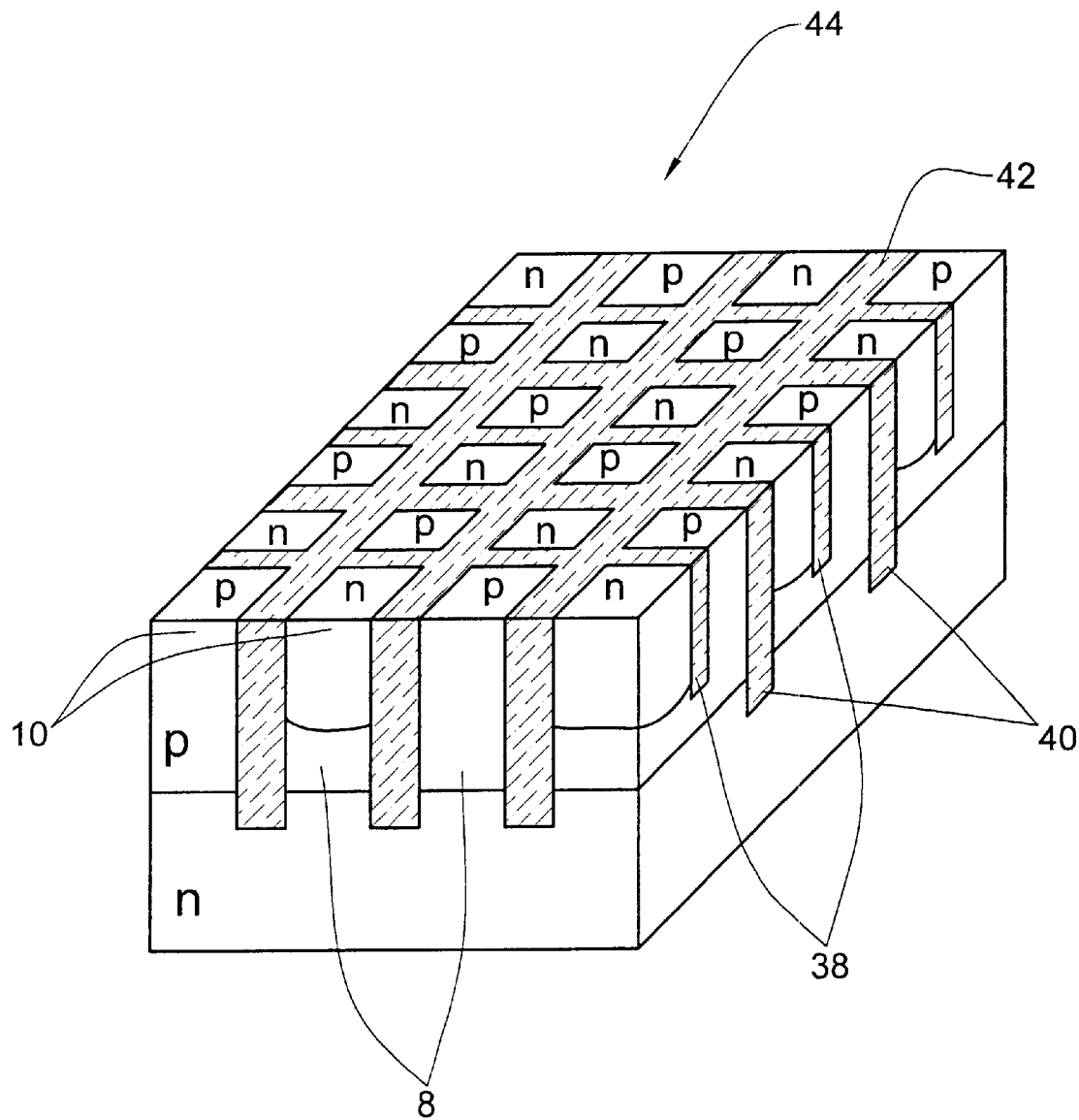

The remaining squares of the masking layer 26 are then removed by etching as seen in FIG. 4, thereby leaving a chessboard pattern of n-type silicon squares 32 doped by sodium within the p-type silicon layer 22. Photolithography using photoresist squares 29 is again used, to cover the n-type silicon squares 32 and part of space between them, leaving alternating narrow aisles 34 and wide aisles 36 exposed. As shown in FIG. 5, Deep Reactive Ion Etching (DRIE) of the silicon substrate 6 is then used to form shallow trenches 38 beneath the narrow aisles 34, and deep trenches 40 beneath the wide aisles 36. The deep trenches 40 are etched down to the n-type silicon wafer 24 of the substrate 6, while the shallow trenches 38 do not extend deeper than the p-type layer 22. The latter step can be replaced by a double etching process to yield the same resulting structure shown in FIG. 5. In the next step, shown in FIG. 6, all of the trenches 38 and 40 between the pillars 8 are filled with low melting point glass 42 and the surface 44 of the structure is polished so that those pillars 8 containing sodium in their upper ends 10 are converted to n-type by thermal diffusion. Photolithography is again performed to cover the glass 42, and a layer of metal, such as copper or titanium for example, can be spread by vacuum deposition, forming junctions between adjacent pillars 8. The low melting point glass 42 between pillars 8 is then removed by chemical etching using a solution of hydrofluoric acid (HF). The resulting structure, which can be seen in FIG. 1, comprises a number of thermocouples 16 uniting neighboring p-type (p) and n-type (n) pillars 8 through junctions 14 with all of the thermocouples 16 being connected in series at the substrate 6 at the layers 20. Electronic circuitry 46 connecting between the remaining unpaired pillars 48a and 48b can be used to read the voltage induced by a change in temperature resulting from the incident radiation R.

Figure 7A:
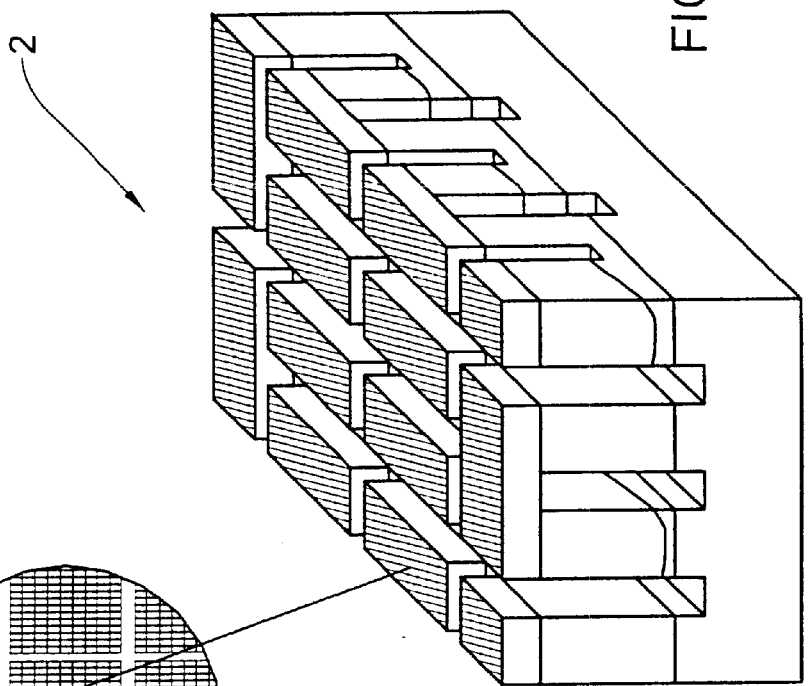
Figure 7B:
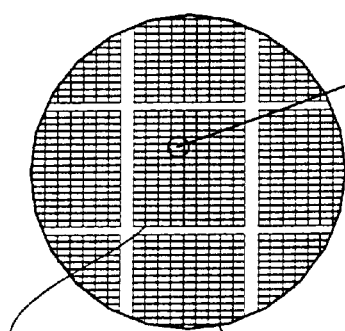
Figure 7C:
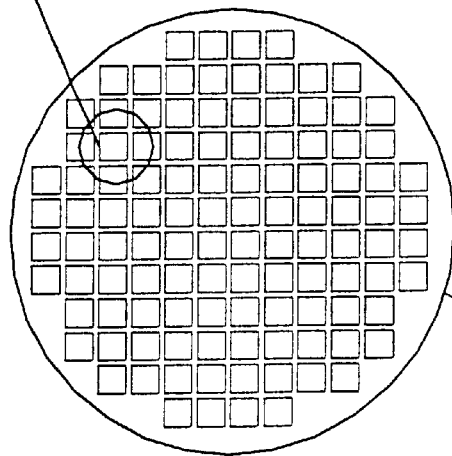

As shown in FIG. 7a, a plurality of detectors 2, each constituting a pixel, any be packed together to form an array 50 (FIG. 7b) of pixels, and many arrays 50 may be fabricated on one silicon wafer 52 (FIG. 7c), for example. The outputs of each detector 2 can be sampled and multiplexed by multiplexer (not shown) located either on the same substrate or on a separate chip, and the resulting data can then be displayed and analyzed.

In order to maximize the area of the face from which the junctions may benefit, the junctions may be covered by a thin, electrically-insulated heat-conducting membrane, which may be either continuous or non-continuous.

Figure 8:
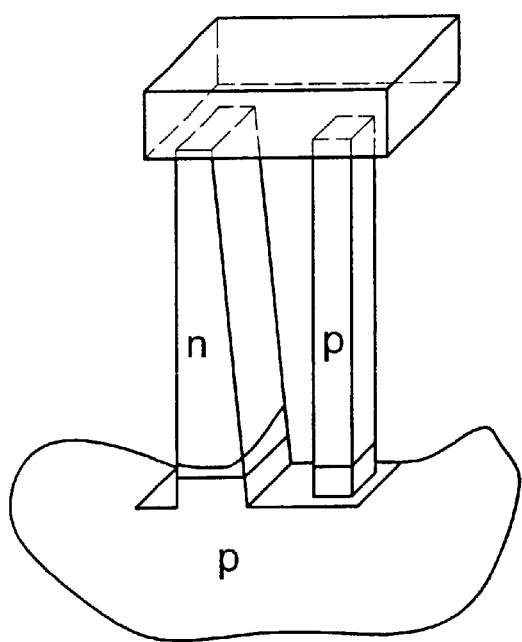
FIGS. 8 to 10 illustrate alternative embodiments of the present invention.
Figure 9:
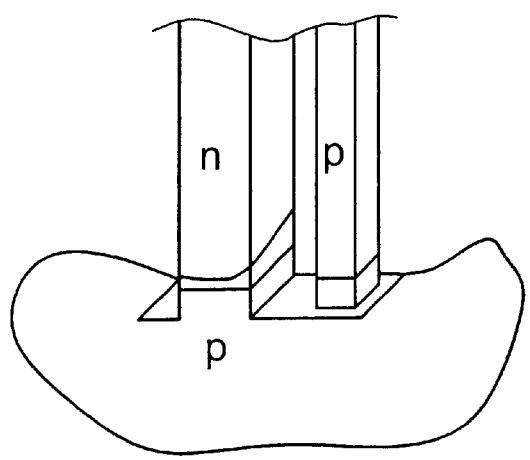

The pillars of the detector of the present invention may be of various lengths, shapes, and uniform or non-uniform cross-sections, e.g. as shown in FIG. 8. Different lengths and cross-sections can be useful since changing the geometry of the pillars modifies their time response. For example, a thermocouple, such as that shown in FIG. 9, having one pillar with a relatively large cross-section compared to the other pillar will have high detectivity but longer response time if the incident radiation is weak. This thermocouple, however, will have decreased detectivity and a shorter response time if the levels of incident radiation are strong. This can only be achieved by the unique design of the present invention.

Figure 10:
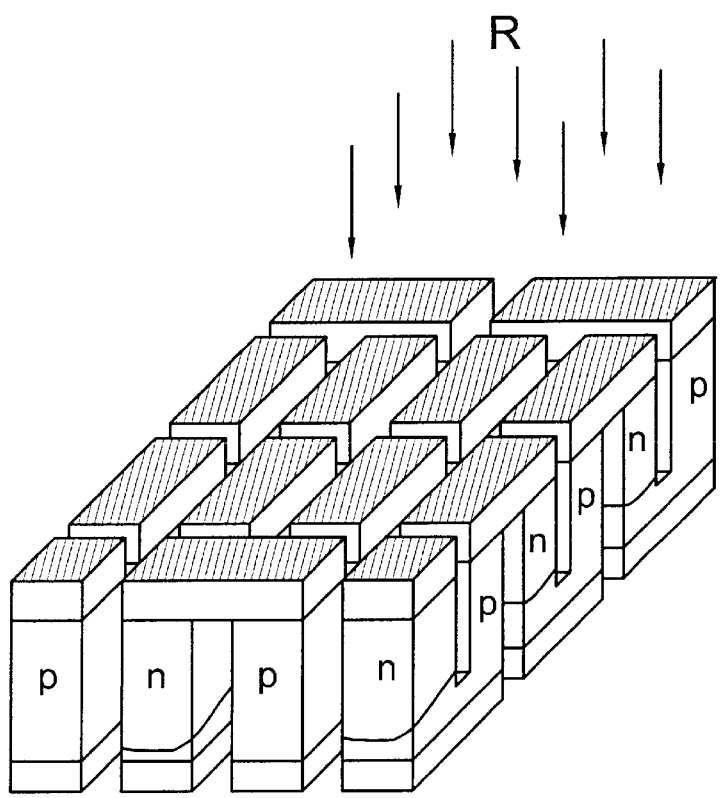
Figure 11:
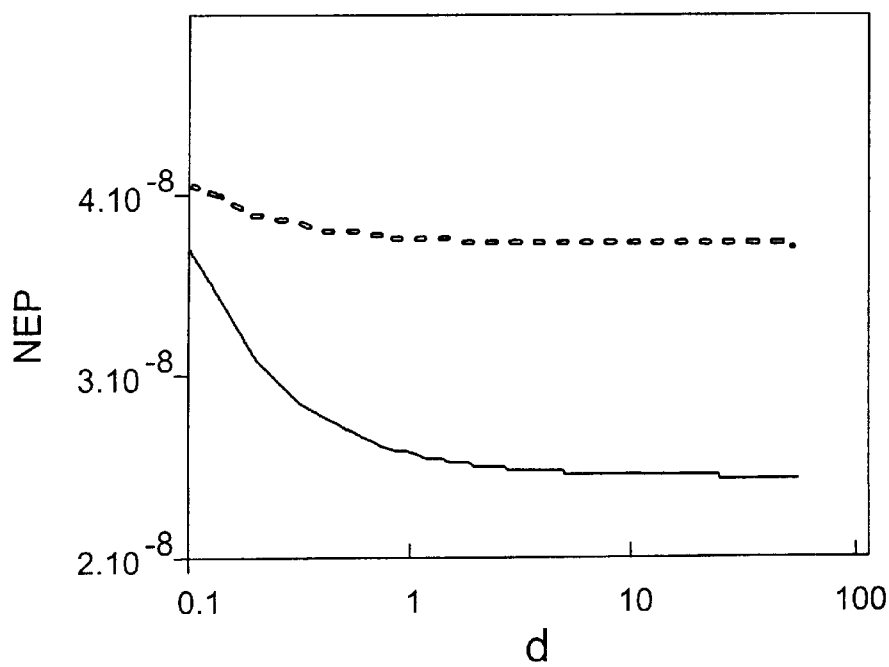
FIG. 11 is a graph of the noise equivalent power (NEP) for a thermoelectric infrared detector of the present invention as a function of the pillar thickness d.

The junctions connecting the pillars may be of different sizes, which may extend within the boundaries of the upper ends of the pillars, or considerably beyond them in a mushroom-like design such as, that shown in FIG. 8. Also, the substrate may be non-continuous as shown in FIG. 10, providing a number of advantages including the need for less material, the saving of space, and others.

The substrate, pillars and junctions of the detector may also be based on semiconductors other than silicon, or of a wide variety and combination of other materials not limited to semiconductors. Converting dopants, other than those of a sodium type may be used, and various manufacturing techniques, such as additive technology, can be employed to arrive at the structure of the present invention. Combinations and permutations of the aforementioned embodiments are also possible.

It should be understood that the above-described embodiments are only examples of a thermoelectric infrared detector according to the present invention and of a method of manufacturing such a detector, and that the scope of the present invention fully encompasses other embodiments which may become obvious to those skilled in the art.

What is claimed is:

1. A thermoelectric infrared detector, comprising a substrate and two kinds of conducting pillars longitudinally extending away from said substrate towards incident infrared radiation, said pillars having upper, hot ends remote from said substrate and lower ends at said substrate, wherein a pair of adjacent pillars of different kinds are electrically connected by a conducting junction at their upper ends, thereby defining a thermocouple, the junctions of different pairs being exposed to said incident radiation.

2. A thermoelectric infrared detector according to claim 1, wherein a plurality of the thermocouples is connected in series.

3. A thermoelectric infrared detector according to claim 1, wherein most of the area exposed to the incident infrared radiation is occupied by the junctions.

4. A thermoelectric infrared detector according to claim 1, wherein at least one of the junctions fully covers the upper ends of the adjacent pillars so that said upper ends are hidden from direct exposure to incident infrared radiation.

5. A thermoelectric infrared detector according to claim 2, wherein the electrical connection of different, consecutive thermocouples in series is achieved at a region near the lower ends of different pillars of said thermocouples.

6. A thermoelectric infrared detector according to claim 5, wherein said region is in the form of a layer shared by the two pillars.

7. A thermoelectric infrared detector according to claim 1, wherein a plurality of detectors are connected forming an array.

8. A thermoelectric infrared detector according to claim 1, wherein the substrate is made of a semiconductor.

9. A thermoelectric infrared detector according to claim 8, wherein the substrate is made of silicon.

10. A thermoelectric infrared detector according to claim 1, wherein the substrate is continuous.

11. A thermoelectric infrared detector according to claim 1, wherein the substrate is non-continuous.

12. A thermoelectric infrared detector according to claim 1, wherein the conducting pillars are made by subtractive technology.

13. A thermoelectric infrared detector according to claim 1, wherein the conducting pillars are made by additive technology.

14. A thermoelectric infrared detector according to claim 1, wherein the conducting pillars are made of oppositely doped semiconductors.

15. A thermoelectric infrared detector according to claim 1, wherein the conducting pillars have a uniform cross-sectional area.

16. A thermoelectric infrared detector according to claim 1, wherein the conducting pillars have a non-uniform cross-sectional area.

17. A thermoelectric infrared detector according to claim 1, wherein all of the conducting pillars have the same cross-sectional area.

18. A thermoelectric infrared detector according to claim 1, wherein the conducting pillars have a variety of cross-sectional areas.

19. A thermoelectric infrared detector according to claim 1, wherein all of the conducting pillars the same length.

20. A thermoelectric infrared detector according to claim 1, wherein the conducting pillars have a variety of lengths.

21. A thermoelectric infrared detector according to claim 1, wherein the junctions are covered by a thin, electrically-insulated heat-conducting membrane.

22. A thermoelectric infrared detector according to claim 21, wherein the membrane is continuous.

23. A thermoelectric infrared detector according to claim 21, wherein the membrane is non-continuous.

* * * * *